United States Patent
Tseng

Patent Number: 5,899,735
Date of Patent: May 4, 1999

[54] METHOD FOR MAKING LOW-RESISTANCE CONTACTS BETWEEN POLYSILICON AND METAL SILICIDE ON SEMICONDUCTOR INTEGRATED CIRCUITS

[75] Inventor: Horng-Huei Tseng, Hsinchu, Taiwan

[73] Assignee: Vanguard International Semiconductor Corporation, Hsin-Chu, Taiwan

[21] Appl. No.: 08/933,960

[22] Filed: Sep. 19, 1997

[51] Int. Cl.[6] .......... H01L 21/283; H01L 21/336
[52] U.S. Cl. .......... 438/592; 438/655; 438/657; 438/660; 438/663
[58] Field of Search .................. 438/592, 637, 438/647, 649, 655, 664, 682, 683, 684, 657, 660, 663; 257/413

[56] References Cited

U.S. PATENT DOCUMENTS

| | | | |
|---|---|---|---|
| 5,045,502 | 9/1991 | Lau et al. | 438/605 |
| 5,057,439 | 10/1991 | Swanson et al. | 438/98 |
| 5,109,258 | 4/1992 | Redwine | 357/23.6 |
| 5,194,404 | 3/1993 | Nagatomo | 438/655 |
| 5,322,809 | 6/1994 | Moslehi | 437/41 |
| 5,399,235 | 3/1995 | Mutsaers et al. | 156/636 |
| 5,498,558 | 3/1996 | Kapoor | 437/43 |
| 5,710,078 | 1/1998 | Tseng | 438/620 |

*Primary Examiner*—T. N. Quach
*Attorney, Agent, or Firm*—George O. Saile; Stephen B. Ackerman

[57] ABSTRACT

A method for making low-resistance contacts between polysilicon and metal silicide on semiconductor integrated circuits is described. The method is particularly useful for making low contact resistance ($R_c$) between the tungsten polycide word lines and the access (pass) transistors (FETs) on DRAMs. A first polysilicon/first silicide (polycide) layer is patterned to form a first polycide conducting layer for the FET gate electrodes. A dielectric layer is deposited over the patterned first polycide layer, and contact openings are anisotropically plasma etched in the dielectric layer to the surface of the first silicide layer. A second doped polysilicon layer is deposited on the substrate and over and in the contact openings contacting the first silicide layer. Prior to depositing a second silicide layer, a high-temperature rapid thermal process (RTP) or annealing is carried out to alter the second polysilicon/first silicide interface to reduce the contact resistance (about 10 ohms). This RTP eliminates the need for overetching the first silicide in the contact holes, as commonly practiced in the prior art. A second silicide layer is deposited and the second silicide/polysilicon (second polycide) is patterned to form the next level of interconnections, such as the word lines for the array of DRAM cells.

20 Claims, 2 Drawing Sheets

METHOD FOR MAKING LOW-RESISTANCE CONTACTS BETWEEN POLYSILICON AND METAL SILICIDE ON SEMICONDUCTOR INTEGRATED CIRCUITS

BACKGROUND OF THE INVENTION (1.) Field of the Invention

The present invention relates to a method for making low-resistance contacts between polysilicon and metal silicide for multilevel interconnections on semiconductor integrated circuits. More particularly, the method relates to forming low-resistance contacts using a rapid thermal process (RTP), thereby eliminating the need to overetch the contact holes to remove the silicide between interconnecting polycide layers.

(2.) Description of the Prior Art

Continuing advances in high-resolution photolithography and anisotropic plasma etching have reduced the minimum feature sizes of semiconductor devices. For example, the current minimum feature size of the gate electrodes for field effect transistor semiconductor devices is sub-half-micrometer ($\mu$m) (about 0.35 $\mu$m or less). These reduced feature sizes require smaller contact holes that lead to higher contact resistance ($R_c$). For example, current contact hole feature sizes are now typically much less than 0.5 micrometer ($\mu$m), and to make contacts to the FET gate electrodes, the contacts must be less than 0.35 $\mu$m in width or diameter. The increase in this parasitic resistance in series with circuit devices, such as field effect transistors (FETs), degrades the circuit performance and therefore is undesirable. A further concern is the wide distribution in contact resistance ($R_c$) that can occur over the large number of contact holes that are simultaneously etched, and is also very undesirable.

It is common practice in the semiconductor industry to interconnect the semiconductor devices by using multilayers of patterned heavily doped polysilicon having a top silicide layer, commonly referred to as polycide layers, and by metal layers to form the integrated circuits. Because of electrical device characteristics and temperature considerations, it is desirable to form the gate electrodes for FETs and the next level of electrical interconnections contacting the gate electrodes from a first and second level of patterned polycide layers, respectively. An InterLevel Dielectric (ILD) layer, hereafter referred to as simply a dielectric layer, is used between the patterned polycide layers to electrically insulate the various levels of patterned polycide layers. Contact holes are formed in the dielectric layer to electrically interconnect the first and second polycide layers. On Ultra Large Scale Integration (ULSI), the number of contacts now well exceeds a million, and it is important to have consistently low and tight distributions of the contact resistance ($R_c$).

The problem of high contact resistance is of particular concern between the two patterned tungsten polycide (silicide ($WSi_2$)/polysilicon) layers used to form the gate electrodes of the pass transistors (FETS) and the word lines for the dynamic random access memory (DRAM) and other integrated circuits, such as static random access memory (SRAM), microprocessors, and the like.

Unfortunately, when the contact holes are etched in the dielectric layer to the first polycide layer, it is difficult to form consistently low contact resistance. For example, contacts having minimum feature sizes of 0.5 $\mu$m or less can have contact resistance that varies from as low as 100 ohms to values exceeding 2000 ohms. Furthermore, interface treatments, such as plasma etching in a gas mixture containing $CH_4$ and $O_2$ to treat the tungsten silicide surface, are not effective, even when portions of the top surface of the first silicide layer are removed. Also, implant doping of the tungsten silicide layer in the contact holes does not provide consistently low contact resistance. One method of consistently reducing the contact resistance is to completely remove the first silicide layer in the contact holes. However, it would be desirable to avoid overetching the contact holes and removing completely the first silicide layer to the first polysilicon layer.

Several methods of forming polycide structures are described in the literature, but do not address the contact resistance problem. For example, Moslehi, U. S. Pat. No. 5,322,809, teaches a method for making self-aligned silicide on the source/drain and FET gate electrode of different thickness, but does not address the high-resistance contact problem between polycide levels. Kapoor, U. S. Pat. No. 5,498,558, shows a method of forming a floating electrode structure for EPROM applications, and completes the structure by forming contacts of doped polysilicon or tungsten to the source/drain and control gate electrode. However, the gate electrode is polysilicon and not polycide, and therefore would not experience the high contact resistance problem. Redwine, U. S. Pat. No. 5,109,258 teaches a method for making memory cells by selective oxidation of polysilicon, and uses a platinum silicide layer on the gate to provide low resistance, but does not address the problem of high contact resistance as commonly experienced with the refractory metals, such as tungsten. Mutsaers et al., U.S. Pat. No. 5,399,235, teach a method for making two levels of aluminum conducting tracks, and would not be concerned or address high contact resistance between polycide layers.

Therefore, there is still a need in the semiconductor industry to reduce the contact resistance between tungsten polycide layers, while avoiding the necessity of removing the first silicide in the contact holes.

SUMMARY OF THE INVENTION

It is therefore a principal object of the present invention to provide a method for forming reliable and repeatable low-resistance contacts between polycide layers.

It is another object of this invention to provide the above method while avoiding the need to overetch the silicide in the contact holes.

Still another object is to provide a simple manufacturing process that is cost effective.

In accordance with the above objectives, a method is provided for making electrical contacts between patterned polycide layers having low resistance ($R_c$). The method is generally applicable for making electrical interconnections on integrated circuits, and is particularly useful for making contacts between the polycide word lines and polycide gate electrodes for field effect transistors (FETs) on DRAM cells. The method begins by providing a semiconductor substrate, such as single-crystal silicon wafers. Typically, the FETs are made in device areas that are isolated from each other by field oxide (FOX) isolation regions. However, the FOX is not essential in understanding this invention, and is not described in detail. The method is specifically described for forming the polycide word lines making low-resistance contacts to the polycide gate electrodes for the FETs. A thin gate oxide is grown on the device areas, and a first polysilicon layer is deposited on the substrate. The first polysilicon layer is $N^+$ doped, for example with arsenic (As) or phosphorus (P), making it electrically conducting. A first silicide layer composed of tungsten silicide is then deposited on the first polysilicon layer to form a first polycide layer that further improves the electrical conductivity. A photoresist mask and anisotropic plasma etching are then used to pattern the first polycide (polysilicon/silicide) layer to form the FET gate electrodes over the device areas. Although the method is described for making contacts to a first polycide layer used for FET gate electrodes, it should be well understood by those skilled in the art that the method is generally applicable to making low-resistance contacts between any two polycide layers on a substrate.

After forming the gate electrodes, source/drain areas are formed adjacent to the gate electrodes by ion implantation. The ion implantation also forms buried bit lines for the array of DRAM cells. For an N-channel FET, as is commonly used as the pass transistor on DRAM cells, the implant would typically be carried out using As or P ions.

After completing the FET, and continuing with the invention, a dielectric layer is deposited over the patterned first polycide layer (gate electrodes) to insulate the first polycide layer from the next level of interconnections. Contact holes are etched in the dielectric layer to the patterned first polycide layer (gate electrodes) for making the electrical connections to the next level of polycide interconnections. For example, the next level of interconnections serves as the word lines for the gate electrodes on the array of DRAM cells. Typically by the prior art, the contact holes would be overetched to remove a portion or all of the first silicide layer to reduce the contact resistance. By the method of this invention, the partial or complete removal of the first silicide layer in the contact holes is not necessary.

Continuing, a photoresist mask and anisotropic etching are used to etch the contact holes in the dielectric layer and expose the surface of the first silicide layer that forms part of the first polycide layer. After etching the contact holes, a doped second polysilicon layer is deposited over the dielectric layer and into the contact holes, making contact to the exposed top surface of the first silicide layer. The second polysilicon layer can be doped either by implanting after the polysilicon is deposited or by in-situ doping during the polysilicon deposition. For example, if N-channel FETs are made for the array of DRAM cells, then the second polysilicon can be doped with an $N^+$ type dopant, such as phosphorus or arsenic.

Now, by the method of this invention, a rapid thermal process (RTP) is carried out in an inert atmosphere to improve the interface between the first $WSi_2$ layer and the second polysilicon layer prior to depositing the second silicide layer. More specifically, the RTP is carried out at a relatively high temperature (e.g., 800–1100° C.) in an inert gas, such as argon (Ar) or helium (He). This results in a lower contact resistance ($R_c$) with narrower distribution in resistance, thereby improving circuit performance. For example, contacts having a contact resistance as low as about 10 ohms can be achieved. A second tungsten silicide ($WSi_2$) layer is deposited to form the second polycide layer. Conventional photolithographic techniques and anisotropic plasma etching are used to pattern the second polycide layer to complete the next level of interconnections, such as the word lines for the array of DRAM cells, and/or connections for other types of circuits, such as SRAMs, microprocessors, and the like.

BRIEF DESCRIPTION OF THE DRAWINGS

The objects and other advantages of this invention are best understood with reference to the preferred embodiment when read in conjunction with the drawings that follow.

DESCRIPTION OF THE PREFERRED EMBODIMENT

Figure 1:
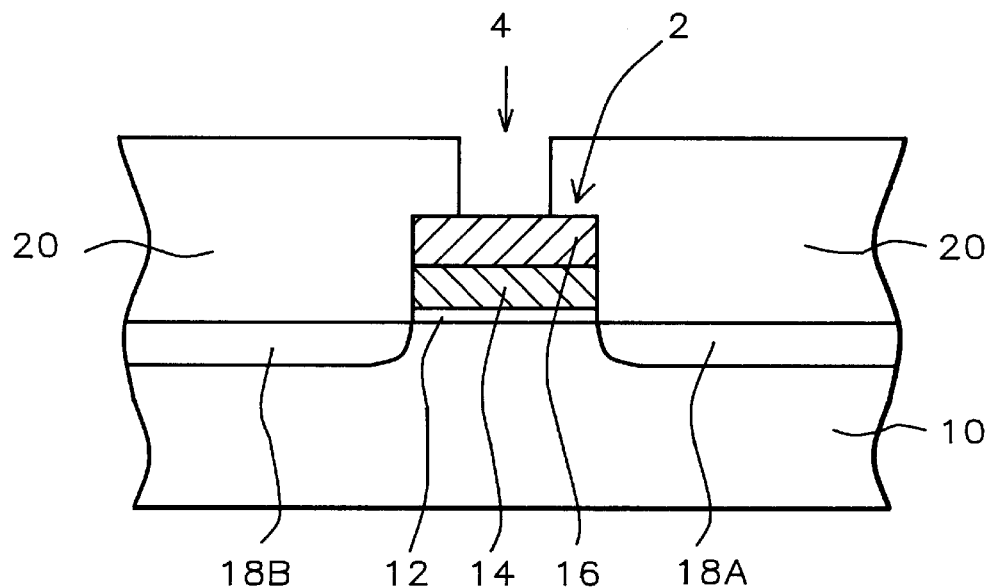
FIGS. 1 through 4 are schematic cross-sectional views showing the sequence of process steps for making two levels of polycide interconnections using a high-temperature rapid thermal process (RTP) for reducing the contact resistance ($R_c$).

Referring now to FIGS. 1 through 4, an embodiment of the invention is described for making contacts having low resistance through contact holes in a dielectric layer between two patterned polycide layers. The polycide layers are used to make electrical interconnections on integrated circuits. The series of steps used to form the contacts having this low contact resistance begins by providing a semiconductor substrate 10, a portion of which is shown in FIG. 1 having a partially completed device (FET) in the device area. The preferred substrate is composed of a single-crystal silicon having a <100> crystallographic orientation. Either a P-type or an N-type conductively doped substrate can be used for the purpose of this invention, or alternatively the substrate can have P-wells or N-wells for forming CMOS-type integrated circuits. However, to simplify the discussion, only a P⁻ substrate is shown in FIG. 1 for providing N-channel FETs for pass transistors on an array of DRAM cells. The method of this invention is shown for making contacts with low resistance to a first polycide layer that can also serve as the gate electrodes for N-channel FETs.

Typically field oxide (FOX) regions are used to isolate the device areas, but are not shown in FIG. 1 to simplify the drawings and discussion.

Still referring to FIG. 1, the FET is formed by first growing a thin oxide layer 12 by thermal oxidation on the device areas to form the FET gate oxide. Typically, the gate oxide is grown to a thickness of between about 50 and 200 Angstroms. The gate electrode for the FET is then formed by depositing a first polysilicon layer 14 on the substrate over the gate oxide 12. The preferred thickness of the first polysilicon layer is between about 1000 and 2000 Angstroms. The polysilicon layer 14 is deposited, for example, by low-pressure chemical vapor deposition (LPCVD). The polysilicon layer 14 is then doped by ion implantation using phosphorus ($P^{31}$) or arsenic ($As^{75}$) ions. Preferably the dopant concentration after implanting is between about 5.0 E 19 and 1.0 E 21 atoms/cm³.

Continuing with FIG. 1, a first silicide layer 16 is then deposited on the first polysilicon layer 14 to form the first polycide layer, which further improves the electrical conductivity. Preferably the silicide layer is composed of a tungsten silicide ($WSi_2$) having a thickness of about 1000 to 2000 Angstroms. One preferred method for forming the silicide layer is by chemical vapor deposition (CVD) using, for example, tungsten hexafluoride ($WF_6$) and silane ($SiH_4$).

Conventional photolithographic techniques and anisotropic plasma etching are now used to pattern the first polycide layer 2 composed of the first polysilicon layer 14 and the first silicide layer 16. The cross section in FIG. 1 depicts the patterned first polycide layer 2. The patterned polycide layer is commonly used to form the gate electrode for the FET over the gate oxide 12 in the device area, portions of which are shown in FIG. 1 for the cross section along the channel length of the FET. Although the method of this invention is described for making contacts with low resistance to the first polycide layer 2 used for FET gate electrodes, it should be well understood by those skilled in the art that the method is generally applicable for making low-resistance contacts between any two polycide layers on the substrate. The FET gate electrodes can also be made with lightly doped source/ drains (LDDs) adjacent to the FET gate electrodes by using sidewall insulating spacers, but are not described here and are not shown in the FIGS. since they are not essential to this invention.

Still referring to FIG. 1 and after patterning the first polycide layer 2, composed of layers 14 and 16, to form the gate electrodes 2, the source/drain contact areas 18A and 18B are formed adjacent to the gate electrodes. The source/drain contact areas are preferably formed by ion implanting using the gate electrode as an implant mask to self-align the source/drain contacts, while using an additional photoresist block-out mask to prevent implanting in other areas of the substrate where the implant is not required. Typically the source/drain contact areas are doped with an $N^+$ type dopant, such as As or P to a concentration of between about 5.0 E 20 and 5.0 E 22 atoms/cm$^3$. For DRAM cells using the stacked Capacitor Over the Bit lines (COB) process, one of the two source/drain areas, such as 18B, can also serve as the buried bit line, and the other source/drain area, such as 18A, can serve as the node contact for the capacitor.

Continuing with the invention, a dielectric layer 20, as shown in FIG. 1, is deposited over the patterned first polycide layer 2 to insulate the first polycide layer from the next level of interconnections. Preferably the dielectric layer 20 is composed of a silicon oxide ($SiO_2$) and is deposited, for example, by LPCVD using a reactant gas such as tetraethosiloxane (TEOS) in a reactor. The preferred thickness of the dielectric layer 20 is between about 3000 and 10000 Angstroms. If desired, layer 20 can be planarized, for example, by chemical/mechanical polishing (CMP) or by other planarizing methods, such as by etch-back techniques, to provide a more planar surface for the next level of interconnections.

Conventional photolithographic techniques and anisotropic plasma etching are now used to etch contact holes 4 in the dielectric layer 20 to the surface of the patterned first silicide layer 16, as also shown in FIG. 1. For example, the etching can be carried out in a high-density plasma etcher using an etchant gas mixture such as trifluoromethane ($CHF_3$), argon (Ar), and oxygen ($O_2$). Alternatively the etchant gas mixture can be carbon tetrafluoride ($CF_4$), Ar, and $O_2$.

If necessary, prior to depositing a second polysilicon layer, the first silicide layer 16 in the contact holes 4 can be subjected to a pre-clean process using, for example, a dilute hydrofluoric acid solution.

Figure 2:
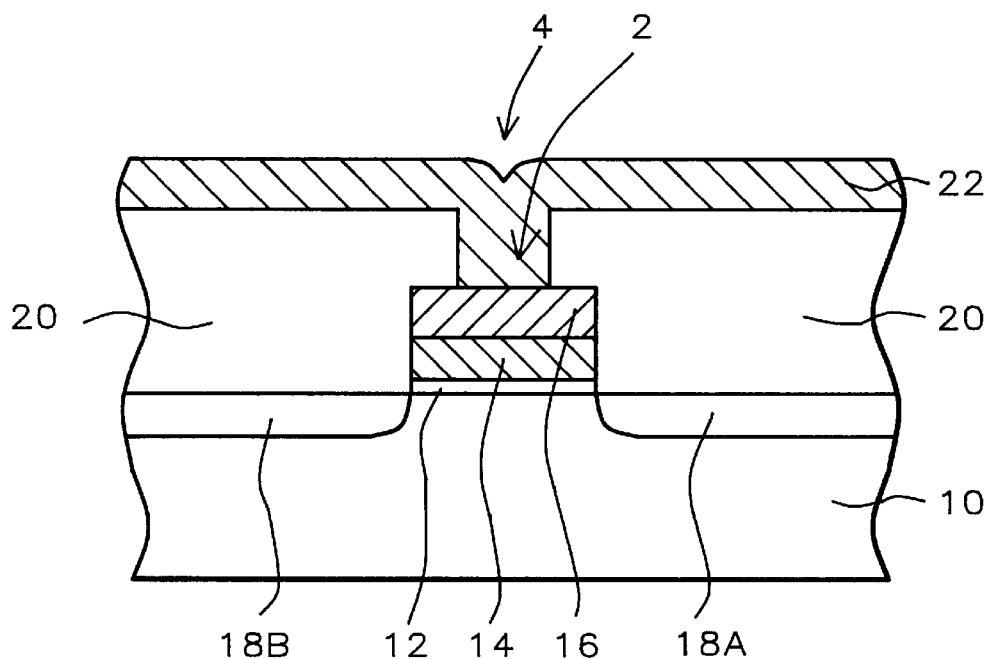

Referring now to FIG. 2, a second polysilicon layer 22 is deposited over the dielectric layer 20 and into the contact holes 4 making contact to the first silicide layer 16. Preferably, the second polysilicon layer 22 is deposited using LPCVD, similar to the deposition of the first polysilicon layer 14, and has a preferred thickness of about 500 to 2000 Angstroms. The second polysilicon layer is now conductively doped. For example, layer 22 can be doped by ion implantation using phosphorus ions ($p^{31}$). Alternatively, layer 22 can be doped in-situ during the LPCVD deposition of the polysilicon by adding a dopant gas, such as phosphine ($PH_3$) to the silane ($SiH_4$). The preferred dopant concentration in the second polysilicon layer is about 1.0 E 20 to 1.0 E 21 atoms/cm$^3$.

Figure 3:
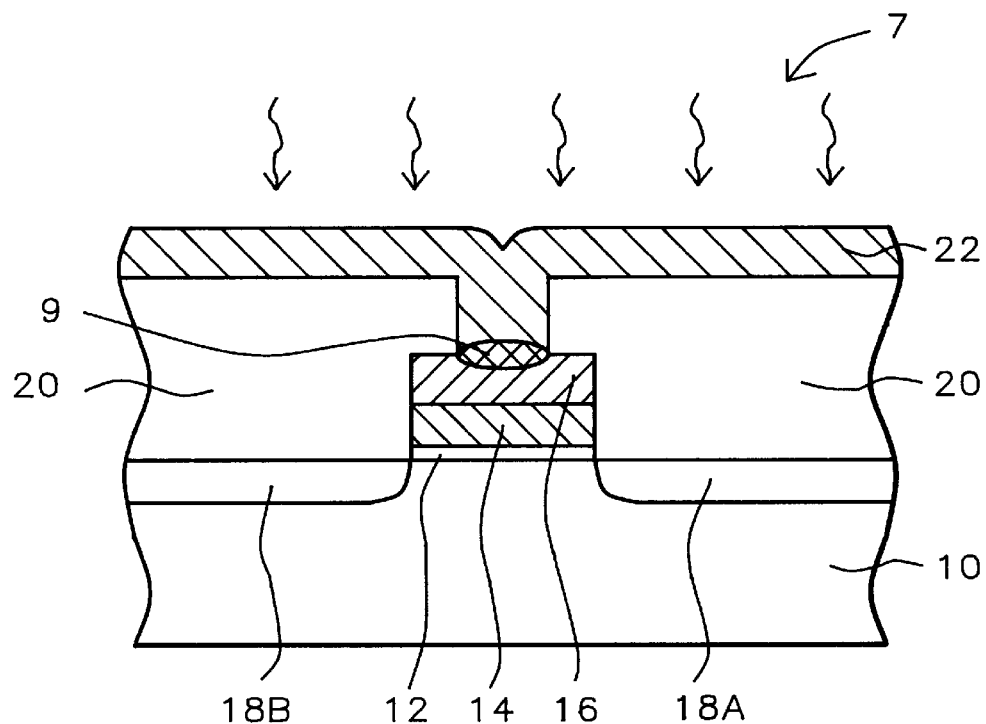

Referring now to FIG. 3, by the method of this invention, a rapid thermal process (RTP) is carried out in an inert atmosphere to improve the interface between the first tungsten silicide ($WSi_2$) layer 16 and the second polysilicon layer 22 prior to depositing the second silicide layer. The rapid thermal process is performed by heating the top surface of the substrate, as indicated by the arrows 7 in FIG. 3. The rapid thermal anneal modifies (changes) the properties at the second polysilicon/first silicide (layers 22 and 16) interface 9 resulting in lower contact resistance. More specifically, the RTP is carried out at a relatively high temperature. Preferably, the RTP is carried at a temperature of between about 800 and 1100° C. for a time of between about 1 and 100 seconds. The thermal anneal is carried out in an inert gas ambient such as argon (Ar) or helium (He) to avoid oxidation of the top surface of the second polysilicon layer 22. For example, the thermal anneal can be performed in RTP equipment, such as model SHS 2800, manufactured by AST Corporation of U.S.A. The rapid thermal process results in a lower contact resistance ($R_c$) with narrower distributions, and improves circuit performance. More specifically the contact resistance can have values as low as about 10 ohms. This provides a significant improvement over the prior art.

Figure 4:
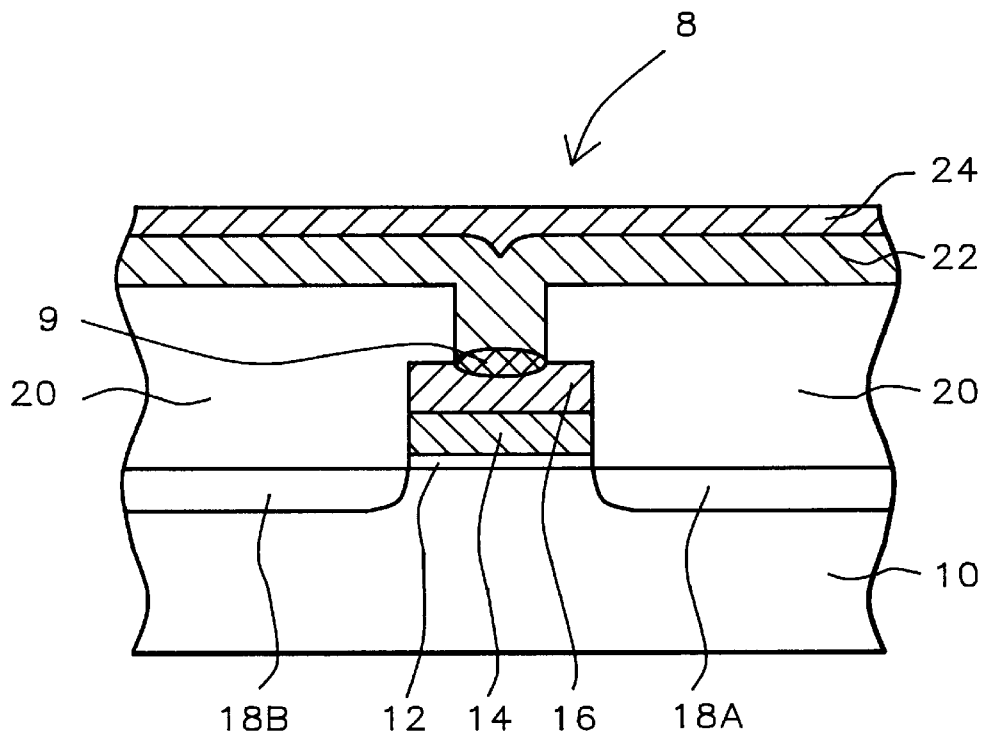

Referring to FIG. 4, a second silicide layer 24 is deposited on the second polysilicon layer 22 thereby forming a second polycide layer 8. The second silicide layer 24 is deposited similar to the deposition of the first silicide layer 16, for example, using LPCVD and tungsten hexafluoride and silane. The silicide layer 24 is commonly used in the semiconductor industry to further reduce the line resistance. The preferred thickness of layer 24 is about 500 to 2000 Angstroms. Conventional photolitho-graphic techniques and anisotropic plasma etching are used to pattern the second polycide layer to complete the next level of polycide interconnections, such as the word lines for the array of DRAM cells, and/or connections for other types of circuits, such as SRAMs, microprocessors, and the like.

While the invention has been particularly shown and described with reference to the preferred embodiment thereof, it will be understood by those skilled in the art that various changes in form and details may be made without departing from the spirit and scope of the invention.

What is claimed is:

1. A method for making improved low-resistance contacts between polysilicon and metal suicides for semiconductor integrated circuits comprising the steps of:

providing a semiconductor substrate having device areas;

depositing a first polysilicon layer on said substrate and over said device areas;

doping and making electrically conductive said first polysilicon layer;

depositing a first silicide layer on said first polysilicon layer thereby forming a first polycide layer;

masking and anisotropically etching said first silicide and said first polysilicon layers and thereby patterning said first polycide layer;

depositing a dielectric layer on said patterned first polycide layer thereby electrically insulating said patterned first polycide layer;

photoresist masking and anisotropically plasma etching contact holes in said dielectric layer to the surface of said first silicide layer;

depositing a second polysilicon layer and doping said second polysilicon layer to form an electrically conducting layer, said second polysilicon layer electrically contacting said first silicide layer in said contact holes;

thermally annealing said second polysilicon layer and thereby reducing the contact resistance between said second polysilicon layer and said first silicide layer;

depositing a second silicide layer on said second polysilicon layer, thereby forming a second polycide layer;

patterning by photoresist masking and anisotropic plasma etching said second polycide layer leaving portions of said second polycide layer over said contact holes, thereby providing said low-resistance contacts between said polysilicon layer of said second polycide layer and said patterned first silicide layer.

2. The method of claim 1, wherein said first polysilicon layer is between about 1000 and 2000 Angstroms thick.

3. The method of claim 1, wherein said first and second polysilicon layers are doped with an N+ dopant to a concentration of between about $5 \times 10^{19}$ and $1 \times 10^{21}$ atoms/cm$^3$.

4. The method of claim 1, wherein said first silicide layer is composed of tungsten silicide and is between about 1000 and 2000 Angstroms thick.

5. The method of claim 1, wherein said dielectric layer is silicon oxide deposited by chemical vapor deposition (CVD), and has a thickness of between about 3000 and 10000 Angstroms.

6. The method of claim 1, wherein said second polysilicon layer is between about 500 and 2000 Angstroms thick.

7. The method of claim 1, wherein said thermal annealing is carried out by rapid thermal annealing (RTA) at a temperature of between about 800 and 1100° C. for a time between about 1 and 100 seconds.

8. The method of claim 1, wherein said thermal anneal is carried out in an inert gas ambient.

9. The method of claim 8, wherein said inert gas is argon.

10. The method of claim 1, wherein said second silicide layer is composed of tungsten silicide and is between about 500 and 2000 Angstroms thick.

11. A method for making improved low-resistance contacts between polysilicon and metal silicide layers for an array of dynamic random access memory (DRAM) cells on a semiconductor substrate comprising the steps of:

providing said semiconductor substrate having device areas with a gate oxide for field effect transistors (FETs);

depositing a first polysilicon layer on said substrate and over said device areas;

doping and making electrically conductive said first polysilicon layer;

depositing a first silicide layer on said first polysilicon layer thereby forming a first polycide layer;

masking and anisotropically etching said first silicide and said first polysilicon layers and thereby patterning said first polycide layer and forming gate electrodes for said FETs;

forming source/drain areas adjacent to said gate electrodes and buried bit lines for said array of DRAM cells;

depositing a dielectric layer on said patterned first polycide layer thereby electrically insulating said patterned first polycide layer;

photoresist masking and anisotropically plasma etching contact holes in said dielectric layer to the surface of said first silicide layer of said patterned first polycide layer;

depositing a second polysilicon layer and doping said second polysilicon layer to form an electrically conducting layer, said second polysilicon layer electrically contacting said first silicide layer in said contact holes;

thermally annealing said second polysilicon layer and thereby reducing the contact resistance between said second polysilicon layer and said first silicide layer;

depositing a second silicide layer on said second polysilicon layer, thereby forming a second polycide layer;

patterning by photoresist masking and anisotropic plasma etching said second polycide layer to form word lines contacting said gate electrodes, thereby providing said low-resistance contacts between said word lines and said gate electrodes for said array of DRAM cells.

12. The method of claim 11, wherein said first polysilicon layer is between about 1000 and 2000 Angstroms thick.

13. The method of claim 11, wherein said first and second polysilicon layers are doped with an N+ dopant to a concentration of between about $5 \times 10^{19}$ and $1 \times 10^{21}$ atoms/cm$^3$.

14. The method of claim 11, wherein said first silicide layer is composed of tungsten silicide and is between about 1000 and 2000 Angstroms thick.

15. The method of claim 11, wherein said dielectric layer is silicon oxide deposited by chemical vapor deposition (CVD), and has a thickness of between about 3000 and 10000 Angstroms.

16. The method of claim 11, wherein said second polysilicon layer is between about 500 and 2000 Angstroms thick.

17. The method of claim 11, wherein said thermal annealing is carried out by rapid thermal annealing (RTA) at a temperature of between about 800 and 1100° C. for a time between about 1 and 100 seconds.

18. The method of claim 11, wherein said thermal anneal is carried out in an inert gas ambient.

19. The method of claim 18, wherein said inert gas is argon.

20. The method of claim 11, wherein said second silicide layer is composed of tungsten silicide and is between about 500 and 2000 Angstroms thick.

\* \* \* \* \*